(12) United States Patent
Takekuma (10) Patent No.: US 6,284,043 B1
(45) Date of Patent: Sep. 4, 2001

(54) SOLUTION TREATMENT APPARATUS

(75) Inventor: Takashi Takekuma, Yamaga (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/109,104

(22) Filed: Jul. 2, 1998

(30) Foreign Application Priority Data

Jul. 3, 1997 (JP) .................................................. 9-195136
Jul. 3, 1997 (JP) .................................................. 9-195138

(51) Int. Cl.$^7$ ....................................................... B05C 5/02
(52) U.S. Cl. ............................... 118/52; 118/56; 118/302; 118/319; 118/320; 118/323
(58) Field of Search ............................... 118/52, 56, 301, 118/302, 304, 315, 316, 319, 320, 323, 406, 416, 50, DIG. 4, DIG. 16; 427/240, 425, 420; 134/902

(56) References Cited

U.S. PATENT DOCUMENTS

| | | | |
|---|---|---|---|
| 5,020,200 | * 6/1991 | Mimasaka et al. | ................ 118/319 |
| 5,169,408 | 12/1992 | Biggerstaff et al. . | |
| 5,209,180 | 5/1993 | Shoda et al. . | |
| 5,374,312 | 12/1994 | Hasebe et al. | ......................... 118/52 |
| 5,375,291 | 12/1994 | Tateyama et al. . | |
| 5,788,773 | * 8/1998 | Okuda et al. | ........................ 118/319 |

FOREIGN PATENT DOCUMENTS

| | | |
|---|---|---|
| 5-13320 | 1/1993 | (JP) . |
| 5-55133 | 3/1993 | (JP) . |
| 7-37797 | 2/1995 | (JP) . |
| 8-45832 | 2/1996 | (JP) . |

* cited by examiner

Primary Examiner—Laura Edwards
(74) Attorney, Agent, or Firm—Rader, Fishman & Grauer (57) ABSTRACT

In a solution treatment apparatus, a nozzle for discharging a treatment solution toward a substrate held by a spin chuck includes a discharge opening for discharging the treatment solution on a surface of the substrate. A collision body against which the treatment solution discharged from the nozzle collides is disposed between the discharge opening of the nozzle and the substrate. Since the collision body is disposed between the discharge opening and the substrate, even when the discharge pressure of the treatment solution is high, the discharged treatment solution once collides against the collision body so that the discharge speed on reaching the substrate is reduced, damage to the substrate is eased, and the amount of air entering into the discharged treatment solution is decreased. Accordingly, no microbubble occurs.

13 Claims, 11 Drawing Sheets

SOLUTION TREATMENT APPARATUS

BACKGROUND OF THE INVENTION

The present invention relates to a solution treatment apparatus for performing the designated treatment after supplying a solution to a substrate.

In a photo-resist process of semiconductor device fabrication, for example, a resist solution is coated on a surface of a substrate such as a semiconductor wafer (referred to as "a wafer" hereinafter) to form a resist film. After the predetermined pattern is exposed, the substrate is developed with a developing solution. A developing unit is used so far in the above developing process.

A developing unit generally includes a rotary stand such as a spin chuck for rotating a wafer while adsorbing and holding it and a developing solution supply nozzle movable to the designated position above the rotary stand. The developing solution supply nozzle has a structure of, as it were, a header with longer length than the diameter of the wafer, and discharge openings disposed in a line on a lower surface thereof. In order to coat a wafer with a developing solution by means of the above developing solution supply nozzle, first, the developing solution supply nozzle is moved to the designated position above the wafer held by the rotary stand, that is, the position just on top of the diameter of the wafer. Next, a developing solution is supplied to the developing solution supply nozzle. While the developing solution is discharged toward the wafer from discharge openings, the wafer makes more than a half rotation so as to uniformly coat the whole surface of the wafer with the developing solution.

Since a developing process is required to perform uniformly, it is desirable that the total time of a discharged developing solution remaining on a wafer is made the same over the whole surface of the wafer as much as possible. Therefore, in order to swiftly coat the whole wafer, discharge pressure is set high and thereafter a developing solution is discharged from discharge openings.

When the discharge pressure of a developing solution is, however, set high as described above, the surrounding air enters into the discharged developing solution, which causes the occurrence of minute bubbles called micro-bubbles in a developing solution film coated on the surface of a wafer. When micro-bubbles occur, only spots of occurrence of micro-bubbles on the surface of the wafer are not developed, and as a result the designated developing process is not performed, thus reducing a yield rate. When a developing solution is discharged at high pressure, impact against a wafer is increased, and there is the possibility that a resist pattern formed by exposure as pretreatment peels off. Especially a resist pattern recently becomes more and more minute, and thus for a minute resist pattern the above possibility is larger.

BRIEF SUMMARY OF THE INVENTION

An object of the present invention is to provide a solution treatment apparatus which can uniformly coat a treatment solution while preventing the occurrence of micro-bubbles.

Another object of the present invention is to provide a solution treatment apparatus which can ease impact against a wafer to stop a resist pattern from peeling off.

Still another object of the present invention is to provide a solution treatment apparatus with a extremely simple structure.

To attain the aforementioned objects, the first aspect of the present invention is a solution treatment apparatus including means for holding a first surface of a substrate provided with the first surface and a second surface and for rotating the substrate, a nozzle provided with at least one discharge opening for discharging a treatment solution through the discharge opening toward the second surface of the rotated substrate, means for supplying the treatment solution to the nozzle, and a collision body, disposed between the discharge opening of the nozzle and the second surface of the substrate, against which the treatment solution discharged from the nozzle collides.

According to this solution treatment apparatus, since the collision body is disposed between the discharge opening and the substrate, even when discharge pressure of the treatment solution is high, the discharged treatment solution once collides against the collision body so that discharge speed on reaching the substrate is reduced, damage to the substrate is eased, and the amount of air entering into the discharged treatment solution is decreased more than ever. Accordingly, the occurrence of micro-bubbles can be prevented more than ever.

The second aspect of the present invention is a solution treatment apparatus including means for holding a first surface of a substrate provided with the first surface and a second surface and for rotating the substrate, at least one nozzle of a hollow cylindrical body, a part of which is formed of a porous film, for spouting out a treatment solution through the porous film to the second surface of the rotated substrate, and means for supplying the treatment solution to the nozzle.

According to this solution treatment apparatus with such a structure, the fabrication of a treatment solution supply portion such as a developing solution supply nozzle is facilitated. Due to a plenty of holes in a porous film, a great deal of treatment solution can be supplied to a substrate such as a wafer. Therefore, the occurrence of micro-bubbles can be stopped. In addition, impact is eased, which prevents a resist pattern from peeling off, for example.

The aforementioned objects and still other objects and advantages of the present invention will become apparent upon reading the following specification when taken in conjunction with the accompanying drawings.

DETAILED DESCRIPTION OF THE INVENTION

Certain terminology will be used in the following description for convenience in reference only and will not be limited. The word "up", "down", "right" and "left" will designate directions in the drawings to which reference is made. The word "in" and "out" will refer to directions toward and away from, respectively, the geometric center of the device and designated parts thereof. Such terminology will include derivatives and words of similar import.

Figure 1:
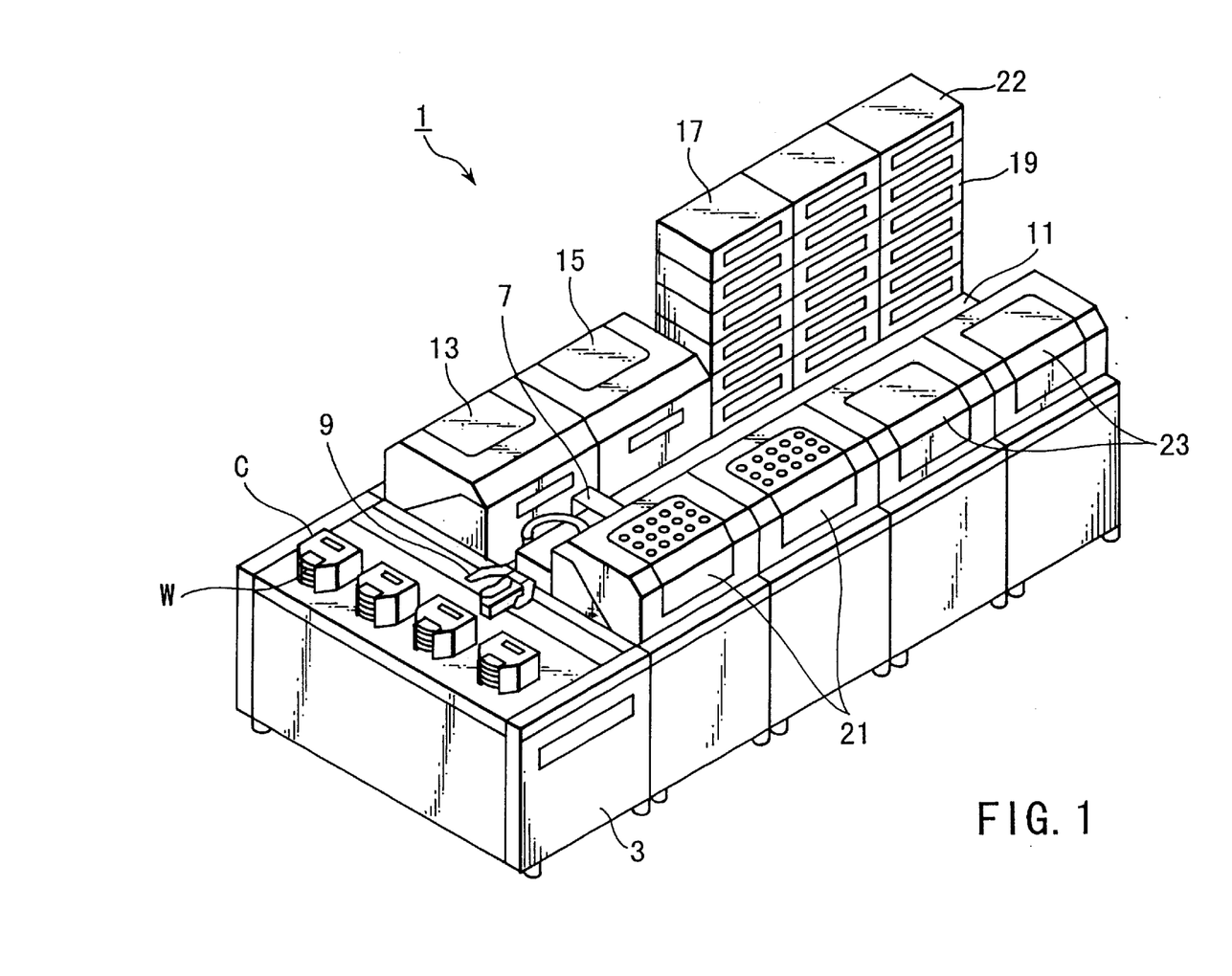
FIG. 1 is a perspective view showing an external appearance of a coating and developing system containing a developing unit according to an embodiment of the present invention.

FIG. 1 illustrates an external appearance of a coating and developing system containing a developing unit as a solution treatment unit according to an embodiment of the present invention. A cassette station 3 is disposed on one end of a coating and developing system 1. More than one cassette C accommodating a wafer W can be freely mounted in the designated position on the cassette station 3. Provided in the front side (in the side of an opening for takeout) of the cassette C on the cassette station 3 are a main carrier arm 7 for carrying and positioning the wafer W and a carrier mechanism 9 for carrying the wafer W between the main carrier arm 7 and the cassette C. Various kinds of processing units for performing the predetermined coating and developing process for the wafer W are disposed on both sides of a carrier path 11 of the main carrier arm 7.

In the coating and developing system 1, a brush scrubber 13 for washing the wafer W taken out from the cassette C, a water washing unit 15 for high-pressure jet washing the wafer W, an adhesion unit 17 for performing hydrophobic treatment for a surface of the wafer W, a cooling unit 19 for cooling the wafer W to the predetermined temperature, a resist coating unit 21 for coating the surface of the rotated wafer W with a resist solution, a thermal processing unit 22 for heating the wafer W after coating it with a resist solution and after exposing it, and a developing unit 23 are disposed.

Figure 2:
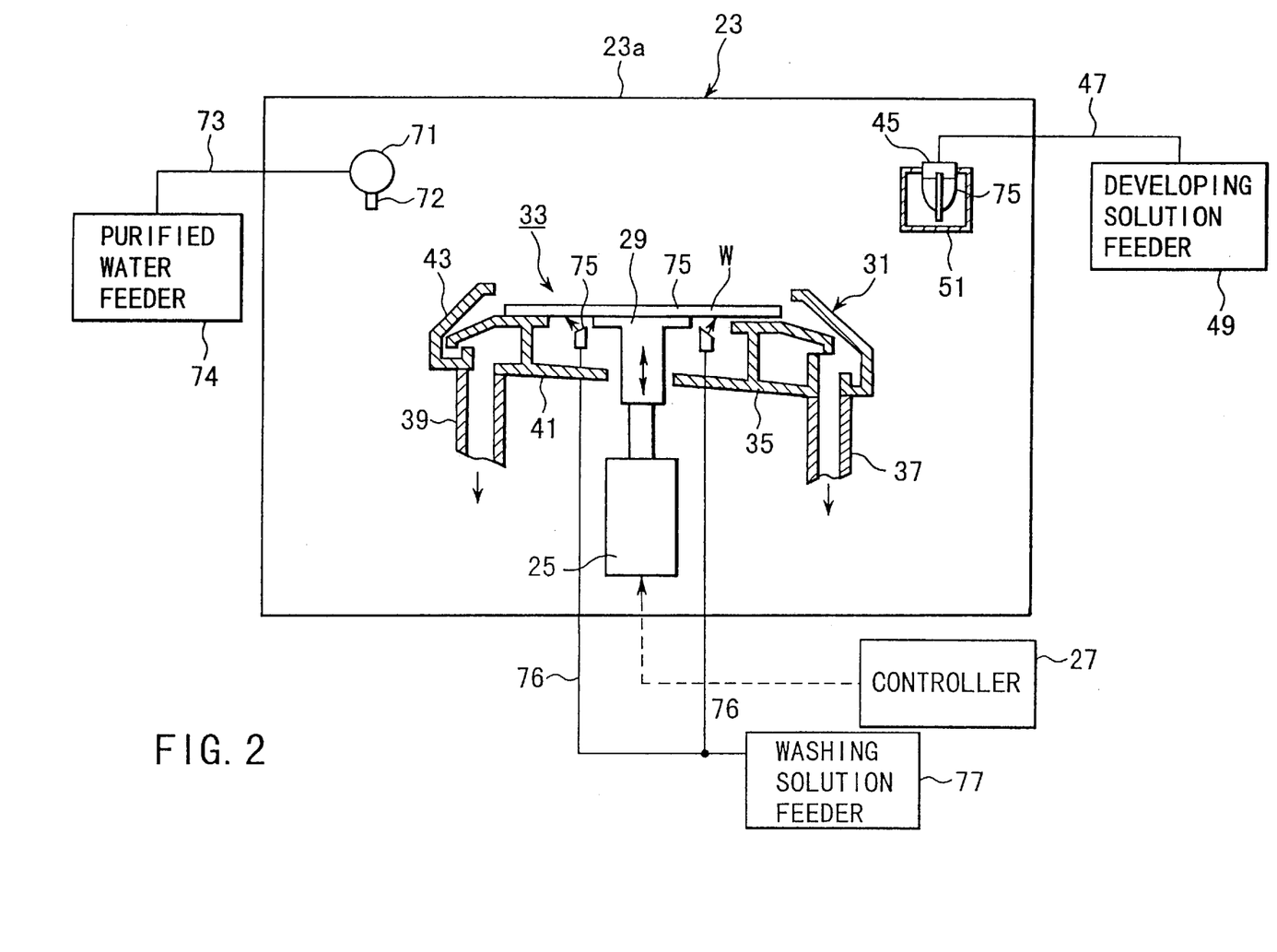
FIG. 2 is a sectional view of a developing unit according to an embodiment of the present invention.
Figure 3:
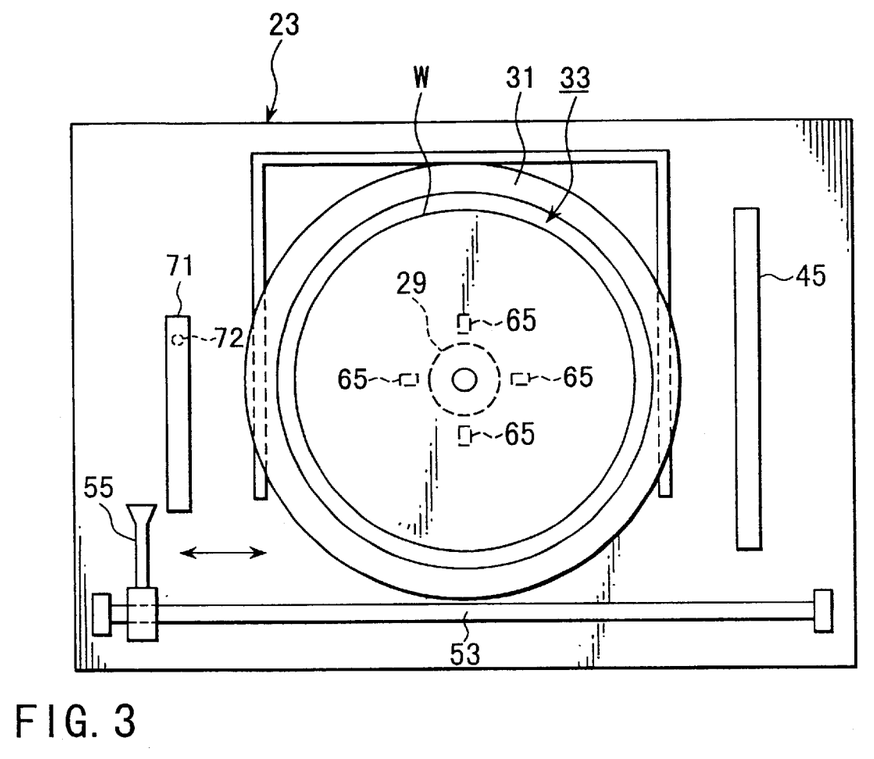
FIG. 3 is a plane view of the developing unit shown in FIG. 2.

As shown in FIG. 2 and FIG. 3, a drive motor 25 is disposed at a center portion in a casing 23a of the developing unit 23. The rotational speed of the drive motor 25 is optionally variable with a controller 27 which is separately disposed outside the unit. Disposed on the upper portion of the drive motor 25 is a spin chuck 29 which is rotatable and vertically movable with the drive motor 25. The wafer W to be developed is adsorbed and held horizontally on an upper surface of the spin chuck 29.

Disposed around the spin chuck 29 is an annular cup 31 made of resin or metal for preventing scatter of a developing solution or a washing solution. A sidewall of the cup 31 is inclined inward, that is, the upper the position thereof is, the narrower the sidewall becomes. The diameter of an opening portion 33 of the cup 31 has length enough to lower and carry the wafer W in a horizontal state into the cup 31.

A base 35 of the cup 31 is inclined and a waste solution disposal pipe 37 is connected to the lowest portion of the base 35. An exhaust pipe 39 for exhausting atmosphere within the cup 31 is disposed opposite to the waste solution disposal pipe 37 across the drive motor 25. An annular wall 41 is set up on the base 35 of the cup 31. Disposed on an upper end of the annular wall 41 is a current plate 43 which is close to the reverse side of the wafer W adsorbed and held on the spin chuck 29. A peripheral portion of the current plate 43 is inclined downward toward the outside.

A developing solution supply nozzle 45 is disposed on one side above the cup 31 in the casing 23a. The developing solution supply nozzle 45 is connected with a developing solution feeder 49 which is disposed outside the developing unit 23 through a developing solution supply pipe 47. The developing solution supply nozzle 45 usually, that is, when not performing any treatment, stands by in a closed container 51 as shown in FIG. 2. Therefore, evaporation and solidification of a developing solution is prevented by atmosphere of a solvent and the like filling the inside of the closed container 51. The developing solution supply nozzle 45 is gripped with a gripping arm 55 which is free to move on a carrier rail 53 shown in FIG. 3, and can reciprocatively move in the directions shown by arrows in FIG. 3 and FIG. 4.

Figures 5, 6:
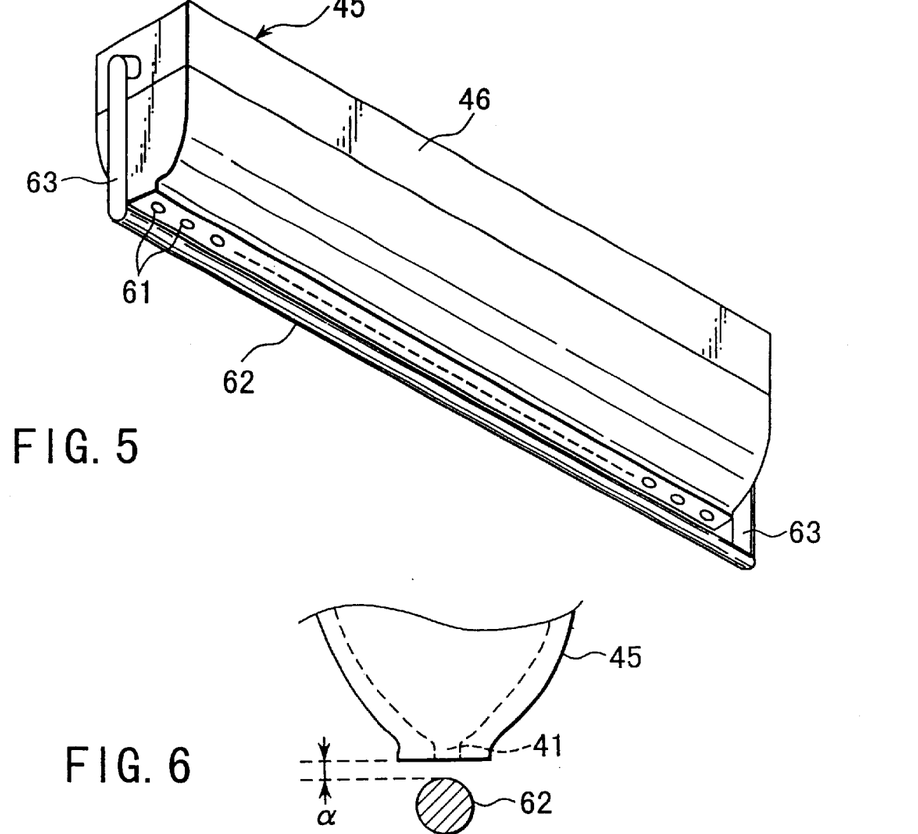
FIG. 5 is a perspective view seen from below showing the developing solution supply nozzle in the developing unit shown in FIG. 2.
FIG. 6 is a sectional view showing a sectional shape of a collision bar attached to the developing solution supply nozzle shown in FIG. 5.

As shown in FIG. 5, the developing solution supply nozzle 45 has a hollow structure with a lower portion of approximately semicircular shape provided with a number of discharge openings 61 which are formed in line. As shown in FIG. 6, a collision bar 62 with a circular-shaped cross-sectional surface is disposed directly below the discharge openings 61. The collision bar 62 is fixed to a frame portion 46 on the upper portion of the developing solution supply nozzle 45 with supporting members 63 and 63 attached to both ends thereof. Proper clearance d is provided between a lower surface of the discharge openings 61 and an upper surface of the collision bar 62. For example, the clearance d is set for 0.5 mm to 2 mm, and preferably for 1 mm.

Figure 4:
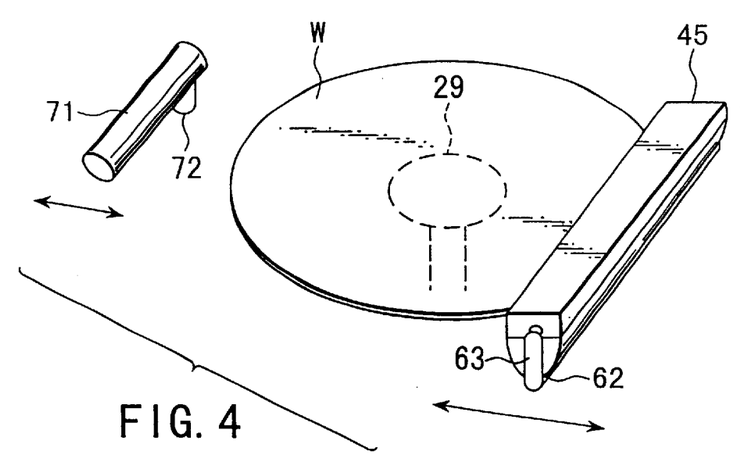
FIG. 4 is a perspective view of a developing solution supply nozzle and a washing solution supply header in the developing unit shown in FIG. 2.

A washing solution header 71 is disposed on the opposite side to the developing solution supply nozzle 45 across the cup 31 as shown in FIG. 2 to FIG. 4. A washing nozzle 72 is attached to the lower portion of the washing solution header 71. The washing solution header 71 is connected to a purified water feeder 74 which is disposed outside the developing unit 23 through a washing solution supply pipe 73 so as to discharge from the washing nozzle 72 purified water supplied from the purified water feeder 74. The washing solution header 71 as well as the developing solution supply nozzle 45 is gripped with the gripping arm 55 and can reciprocatively move in the directions shown by arrows in FIG. 3 and FIG. 4.

As illustrated in FIG. 2, separately disposed in the developing unit 23 is a washing nozzle 75 for supplying a washing solution such as purified water to the reverse side of the wafer W. The washing nozzle 75 is connected to a washing solution feeder 77 through a supply pipe 76. Accordingly, it is possible to wash the reverse side of the wafer W with purified water, for example. The washing solution feeder 77 can be used in common with the purified water feeder 74.

Figure 7:
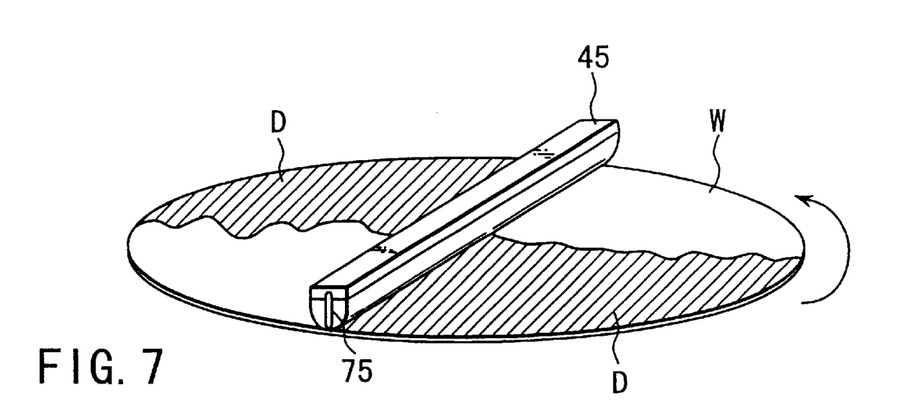
FIG. 7 is a perspective view showing the state of a developing solution being coated on a wafer with the developing solution supply nozzle shown in FIG. 5.

The developing unit 23 according to this embodiment has the above structure. The wafer W is mounted on the spin chuck 29 in the cup 31 after being exposed and the developing solution supply nozzle 45 is gripped with the gripping arm 55 to move to the designated position, that is, the position above the wafer W where the length of the nozzle is the same as the diameter of the wafer W. Subsequently, the developing solution supply nozzle 45 descends. As shown in FIG. 7, when a developing solution is supplied to the developing solution supply nozzle 45 from the developing solution feeder 49 while the wafer W is rotating at a low speed, a developing solution is discharged downward for the wafer W from each of the discharge openings 61 formed in a line on the lower surface thereof. Thereafter the wafer W is coated with the developing solution and the designated developing process is performed.

At this time, the collision bar 62 is disposed right under the discharge openings 61 so that a developing solution D discharged from the discharge openings 61 once collides against the collision bar 62, and then is coated on the wafer W. Thus, the discharge speed of the developing solution D is eased and reduced by the collision bar 62, and the surface of the wafer W is coated with the developing solution D, the discharge speed of which slows down. As a result, entrance of the surrounding air is prevented and no micro-bubble occurs in the developing solution D coated on the wafer W. In addition, when the developing solution D reaches the wafer W, the speed thereof slows down, whereby impact against the wafer W is eased and a resist pattern on the wafer W does not peel off, thus improving a yield rate. Moreover, the collision bar 62 has a circular-shaped cross-sectional surface so that the developing solution D never remains on the surface of the collision bar 62.

The developing solution supply nozzle 45 used in this embodiment includes the discharge openings 61 forming a line on the lower surface thereof. The collision bar 62 is disposed right under the discharge openings 61. If a developing solution supply nozzle 81 shown in FIG. 9 is, however, used instead of the nozzle 45, a larger quantity of developing solution can be discharged per unit hour.

Figure 9:
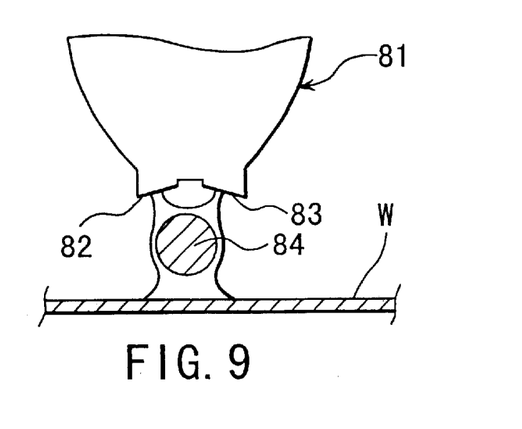
FIG. 9 is an explanatory view showing the state of a developing solution being discharged from another developing solution supply nozzle usable for the developing unit shown in FIG. 2.

Specifically, the developing solution supply nozzle 81 shown in FIG. 9 has discharge openings 82 and 83 formed in two lines on the lower surface thereof, and a collision bar 84 is disposed right under the center between two lines. The discharge openings 82 and 83 in each line surface slightly inward each other, namely, surface the collision bar 84. According to the developing solution supply nozzle 81 with such a structure, similarly to the aforesaid developing solution supply nozzle 45, a developing solution discharged from the discharge openings 82 and 83 once collides against the collision bar 84, whereby the speed thereof slows down, and thereafter the developing solution is supplied to the wafer W. Accordingly, the amount of air entering in the solution is less than ever and impact against the wafer W is eased. In addition, the discharge openings 82 and 83 are disposed in two lines so that a larger quantity of developing solution can be discharged per unit hour compared with the aforementioned developing solution supply nozzle 45, which results in improvement in throughput.

As described above, when a substrate is coated with a treatment solution while being rotated with a nozzle which is disposed just on top of the diameter of a waffer and is provided with dishcharge openings forming a line over the length equivalent to the diameter of the waffer, it is extremely possible that a resist pattern peels off more in a center portion of the wafer W, since the moveing distance per unit hour is different between the center portion and an edge portion of the wafer W.

Figure 8:
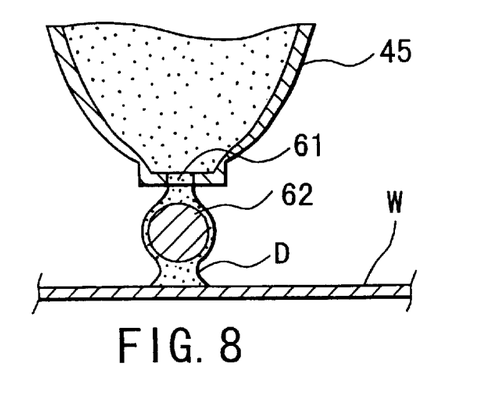
FIG. 8 is an explanatory view showing the state of a developing solution being discharged from the developing solution supply nozzle shown in FIG. 5.
Figure 10:
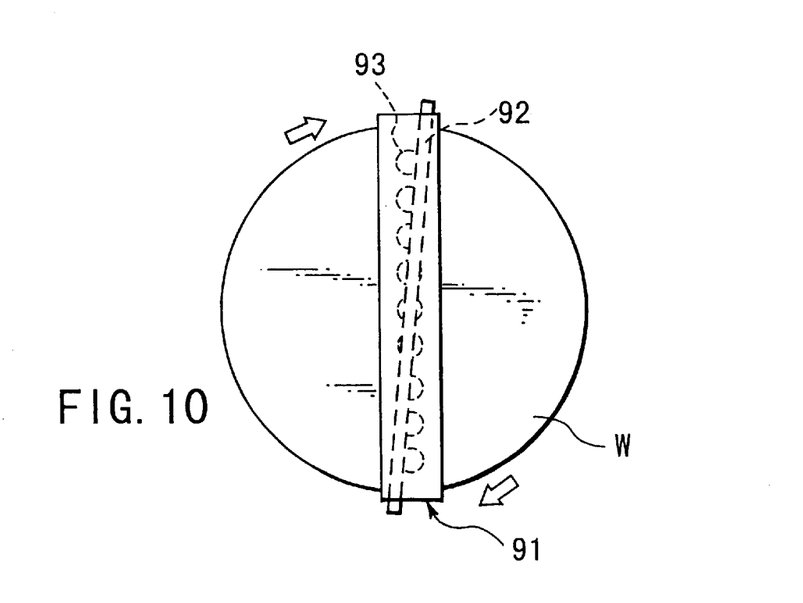
FIG. 10 is a plane view showing the disposition of a collision bar of another developing solution supply nozzle usable for the developing unit shown in FIG. 2.
Figure 11:
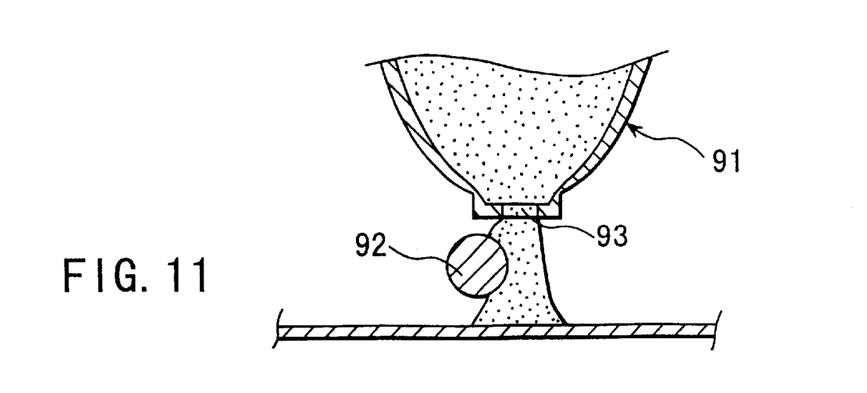
FIG. 11 is an explanatory view showing the disposition of the collision bar of the developing solution supply nozzle shown in FIG. 10.

A developing solution supply nozzle 91 shown in FIG. 10 is structured in view of the above disadvantages. Specifically, a collision bar 92 disposed under the lower surface of the developing solution supply nozzle 91 has a center portion thereof being disposed at the same position as the center of a line of discharge openings 93 formed on the lower surface of the nozzle, and both end portions thereof being disposed slantwise. Therefore, all of developing solution discharged from the discharge opening 93 disposed at the center portion once collides against the collision bar 92 and the speed thereof is eased similarly to the discharging state shown in FIG. 8, but the closer to both end portions the discharge opening 93 is, the more the collision bar 92 slants from right below the discharge opening 93. As a result, as shown in FIG. 11, part of the developing solution D discharged from the discharge opening 93 close to both end portions collides against the collision bar 92 and the speed thereof slows down, but the remaining solution directly reaches the surface of the wafer W at the initial speed without slowing down.

The area of coating by the discharge opening 93 close to both end portions is, however, an edge portion of the wafer W, and the moving distance per unit hour is long. In other words, the area to be coated per unit hour is wide. Accordingly, when the edge portion or its vicinities of the wafer W are coated, total damage to the wafer W is the same as that in a center portion even if the speed of a developing solution on reaching the wafer W is less eased compared with the center portion. Thus, if the developing solution supply nozzle 91 shown in FIG. 10 is used, uniform coating for the wafer W can be performed.

Each collision bar, that is, a collision body used in each of the aforesaid developing solution supply nozzles has a circular-shaped cross-sectional surface, but the shape of a Collision body, that is, a collision bar applicable to the present invention is not limited to a circular shape.

Figure 12:
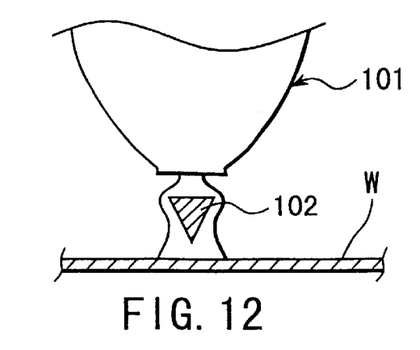
FIG. 12 is a sectional view showing a shape of another collision bar usable for the developing unit shown in FIG. 2.

A collision bar 102 disposed under a lower surface of a developing solution supply nozzle 101 shown in FIG. 12 has an inverted triangle-shaped cross-sectional surface, and the use of the above collision bar 102 is effective. To be concrete, the speed of a discharged developing solution slows down to a great extent and there occurs little entrance of the surrounding air.

Figure 13:
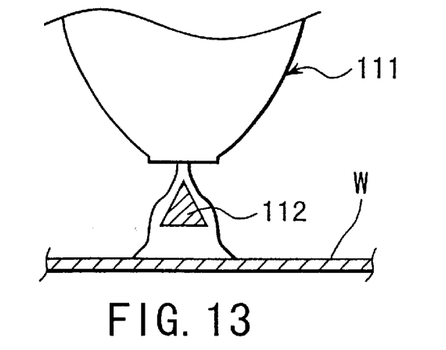
FIG. 13 is a sectional view showing a shape of another collision bar usable for the developing unit shown in FIG. 2.

A collision bar 112 used for a developing solution supply nozzle 111 shown in FIG. 13 has a triangle shaped cross-sectional surface. By means of the collision 112, the speed of a discharged developing solution slows down less than that in the aforesaid collision bar 102. Therefore, the collision bar 112 is suitable when discharge pressure is not so high.

Figure 14:
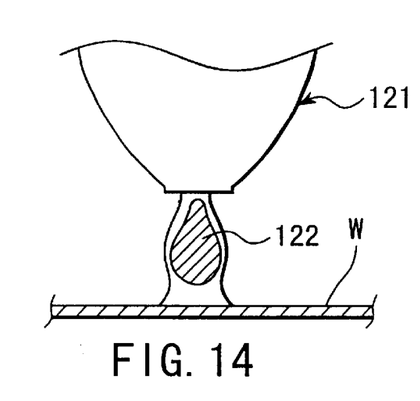
FIG. 14 is a sectional view showing a shape of still another collision bar usable for the developing unit shown in FIG. 2.

A collision bar 122 used for a developing solution supply nozzle 121 shown in FIG. 14 has a tear drop shaped cross-sectional surface. By means of the collision bar 122 with such a shape, the speed can slow down more and entrance of air is less in comparison with the aforesaid developing solution supply nozzle 111 in FIG. 13.

Figure 15:
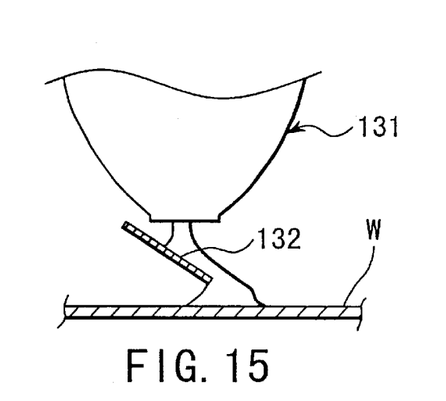
FIG. 15 is a sectional view showing a shape of a collision plate usable for the developing unit shown in FIG. 2.

Moreover in a developing solution supply nozzle 131 shown in FIG. 15, a flat-shaped collision plate 132 instead of the aforesaid cylindrical-shaped collision bar is disposed slantwise. The use of the collision plate 132 brings good effects that a discharged developing solution can be coated on the wafer W while flowing in a specified direction. In addition, it is possible to adjust the degree of reduce in speed of a developing solution by changing the attaching angle of the collision plate 132.

Developing solution supply nozzles of this kind are properly provided with a suction mechanism which is called a suck-back mechanism for preventing a solution from dripping. A collision bar, that is, a collision body in the present invention can also be provided with such a mechanism for preventing a treatment solution such as a developing solution or the like adhering to the collision bar from dripping.

Figure 16:
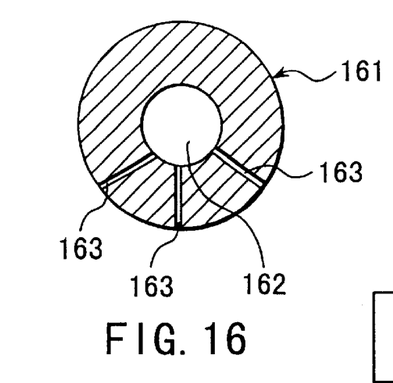
FIG. 16 is a sectional view showing an inner shape of another collision bar usable for the developing unit shown in FIG. 2.
Figure 17:
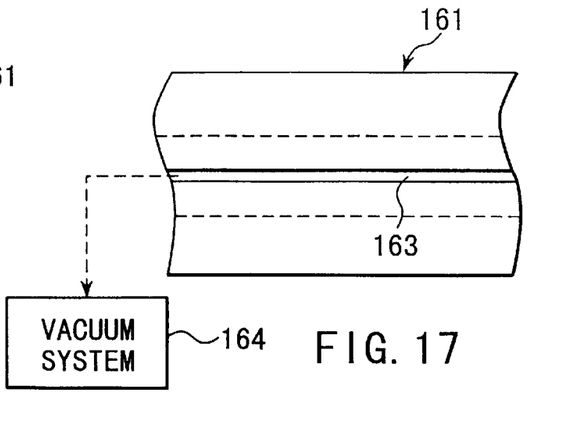
FIG. 17 is a fragmentary bottom view of the collision bar shown in FIG. 16.

A collision bar 161 shown in FIG. 16 and FIG. 17, for example, includes a hollow portion 162, and slits 163 are formed at a downward angle along a longitudinal direction on the surface of the collision bar 161, the slits 163 leading to the hollow portion 162. The hollow portion 162 is communicated with a vacuum system 164. If the collision bar 161 with the above structure is used and the vacuum system 164 is operated after a developing solution is coated, a treatment solution adhering to the vicinity of the slits 163 can be sucked to the hollow portion 162 through the slits 163. Accordingly, it is possible to prevent a solution from dripping from the collision bar 161.

Figure 18:
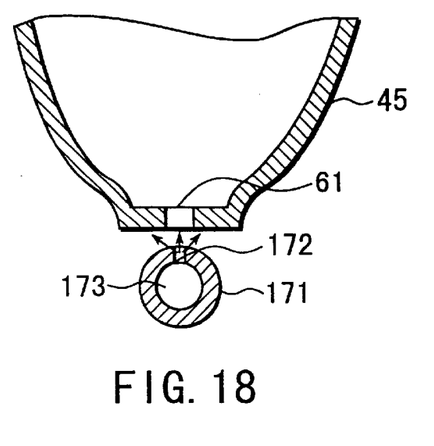
FIG. 18 is a sectional view showing the state of a discharge opening being washed by a collision bar provided with a washing solution discharge portion.
Figure 19:
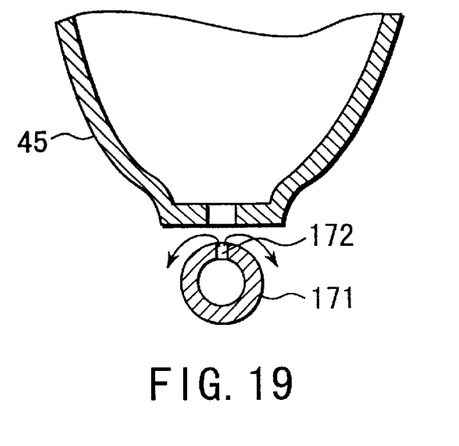
FIG. 19 is a sectional view showing the state of the surface of a collision bar itself being washed by the collision bar provided with a washing solution discharge portion.

A collision bar 171 shown in FIG. 18 is provided with a washing solution discharge portion 172 for washing the discharge openings 61 of the developing solution supply nozzle 45. A hollow portion 173 which is a flow path for a washing solution is formed within the collision bar 171 as illustrated in FIG. 18. A plurality of hole-shaped washing solution discharge portions 172 leading to the hollow portion 173 are formed on a surface of the collision bar 171 opposite to the discharge openings 61 of the developing solution supply nozzle 45, that is, the upper surface of the collision bar 171 in FIG. 18 along a longitudinal direction of the collision bar 171. For example, the washing solution discharge portions are formed opposite to the discharge openings 61 of the developing solution supply nozzle 45.

If the collision bar 171 with such a structure is used, when a washing solution is discharged from the washing solution discharge portions 172 by way of the hollow portion 173, the discharge openings 61 of the developing solution supply nozzle 45 can be washed with a discharged washing solution as shown in FIG. 18, since the washing solution discharge portions 172 are disposed opposite to the discharge openings 61 of the developing solution supply nozzle 45. Thus, the discharge openings 61 can be kept clean. Washing of discharge openings by discharge of a washing solution may be performed every time the designated times of a developing process finish or after a lapse of the designated period. In addition, the washing solution discharge portions 172 does not necessarily surface the discharge openings 61 as described above. Instead, they may be disposed in positions where a washing solution discharged from the washing solution discharge portions 172 can be discharged toward the discharge openings 61.

If discharge pressure of a washing solution from the washing solution discharge portions 172 is reduced, the washing solution discharged from the washing solution discharge portions 172 directly drip down along the surface of the collision bar 171 without reaching the discharge openings 61, thereby making it possible to wash the surface of the collision bar 171 itself. Accordingly, first the discharge pressure of a washing solution is set high so as to wash the discharge openings 61 as shown in FIG. 18, and thereafter the discharge pressure is decreased so that the surface of the collision bar 171 can be washed consecutively. Thus, it can be efficiently and effectively prevented that a washing solution which drops when the discharge openings 61 are washed therewith remains on the surface of the collision bar 171 to cause contamination. Thus, it can be efficiently and effectively prevented that a washing solution which drops when the discharge openings 61 are washed therewith remains on the surface of the linear baffle 171 to cause contamination.

If a suction mechanism as a suck-back mechanism is further added to the collision bar 171 provided with washing solution discharge portions 172 for discharging a washing solution in the same way as the above, a washing solution adhering to the surface of the collision bar 171 can be sucked, thereby preventing a washing solution from dripping. In addition, if a surface of each collision bar used in each of the aforesaid embodiments is hydrophobic-coated with HMDS (hexamethyldisilazane), Teflon or the like, it is possible to stop adhesion itself of treatment solutions including a developing solution or other washing solutions.

Next, another embodiment according to the present invention will be described.

Figure 20:
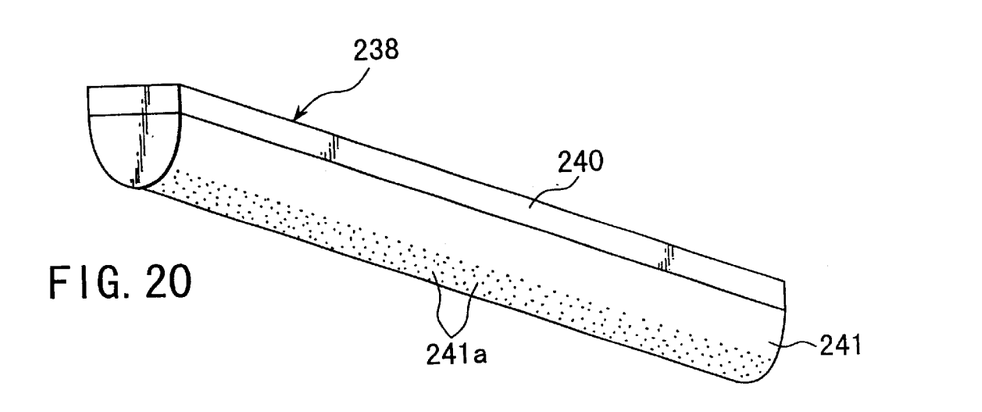
FIG. 20 is a perspective view seen from below showing a developing solution supply nozzle in a developing unit according to another embodiment.
Figure 21:
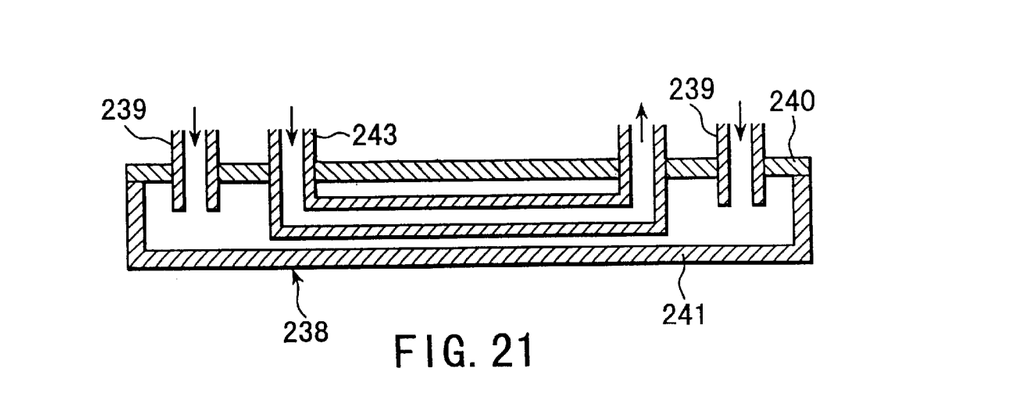
FIG. 21 is a sectional view of the developing solution supply nozzle shown in FIG. 20.

FIG. 20 and FIG. 21 show the structure of a developing solution supply nozzle according to this embodiment.

As shown in FIG. 20, a developing solution supply nozzle 238 consists of a frame portion 240 and a hollow cylindrical body portion 241. A lower surface of the cylindrical body portion 241 is formed of a porous film and a number of developing solution discharge openings 241a for discharging a developing solution toward the wafer W are formed thereon.

FIG. 21 is a sectional view of the developing solution supply nozzle 238, and a developing solution supply pipe 239 is communicated with the cylindrical body portion 241 of the developing solution supply nozzle 238. According to the above structure, a developing solution from a developing solution feeder 49 is supplied to a hollow portion of the cylindrical body portion 241 through the developing solution supply pipes 239 and 239. A temperature controlling pipe 243 is disposed within the cylindrical body portion 241 so as to control the temperature of a developing solution to the desired temperature by circulating a temperature controlling fluid through the temperature controlling pipe 243, for example, by flowing and circulating water set at the predetermined temperature.

Figure 22:
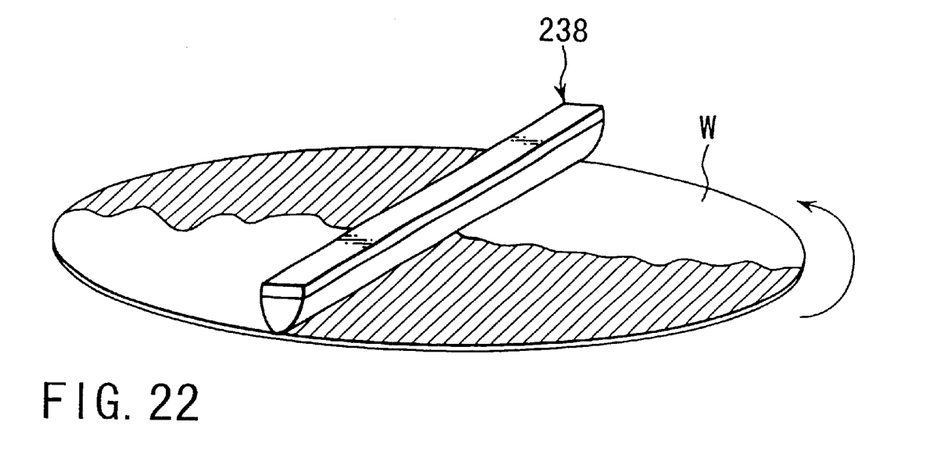
FIG. 22 is an explanatory view showing the state of a developing solution being coated on a wafer with the developing solution supply nozzle shown in FIG. 20.

When the wafer W is mounted on the spin chuck 29, the developing solution supply nozzle 238 moves to the predetermined position above the wafer W. When the wafer W is made at least a half rotation as shown in FIG. 22 while the developing solution is supplied from the cylindrical body portion 241, the developing solution is coated on the wafer W.

Figure 23:
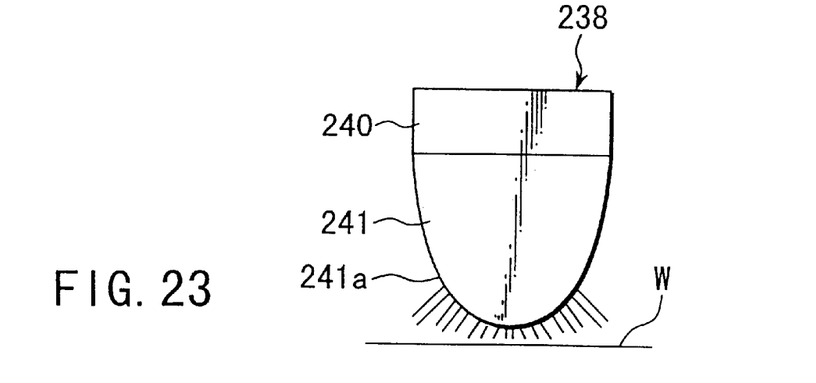
FIG. 23 is an explanatory view showing the state of a developing solution being discharged from the developing solution supply nozzle shown in FIG. 20.

At this time, since a lower surface of the cylindrical body portion 241 of the developing solution supply nozzle 238 is formed of a porous film, a developing solution is discharged from a number of the developing solution discharge openings 241*a* toward the wafer W as shown in FIG. 23. Therefore, a larger quantity of developing solution can be supplied, thereby holding down discharge pressure of the developing solution. As a result, entrance of the surrounding air can be stopped and the occurrence of micro-bubbles can be prevented. Besides, since the discharge pressure of the developing solution is low, impact against a resist pattern on the wafer W can be eased and the resist pattern can be prevented from peeling off.

Moreover, the lower surface of the cylindrical body portion 241 is formed of a porous film, which facilitates the fabrication of the developing solution supply nozzle 238 with such many developing solution discharge openings 241*a*. In addition, the temperature controlling pipe 243 is disposed within the cylindrical body portion 241, which make it possible to control the temperature of the developing solution immediately before discharge thereof.

Since the cylindrical body portion 241 for supplying the developing solution to the wafer W is supported with the frame portion 240, the developing solution supply nozzle 238 can follow swift motion of the gripping arm 55 and the structure becomes firm, which secures more efficient developing process.

In the aforementioned embodiment, the temperature controlling pipe 243 is disposed within the cylindrical body portion 241. A deaerating module 250 as a deaerating mechanism which will be described later can also be disposed within the cylindrical body portion 241. A developing unit provided with the deaerating module 250 will be described hereinafter.

Figure 24:
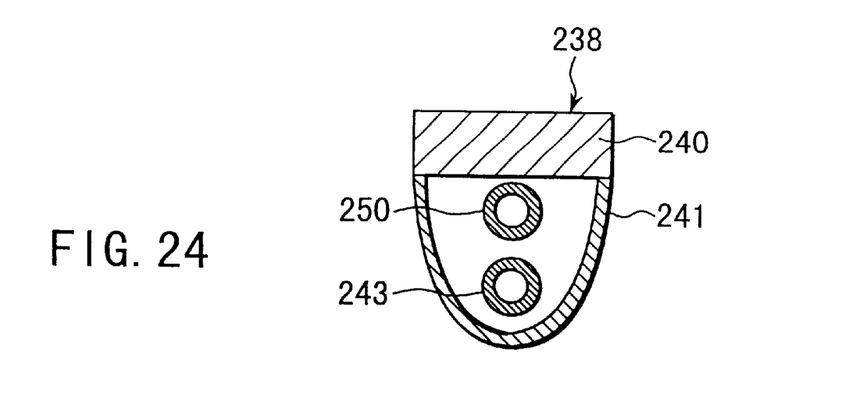
FIG. 24 is a sectional view of a developing solution supply nozzle in a developing unit according to still another embodiment.
Figure 25:
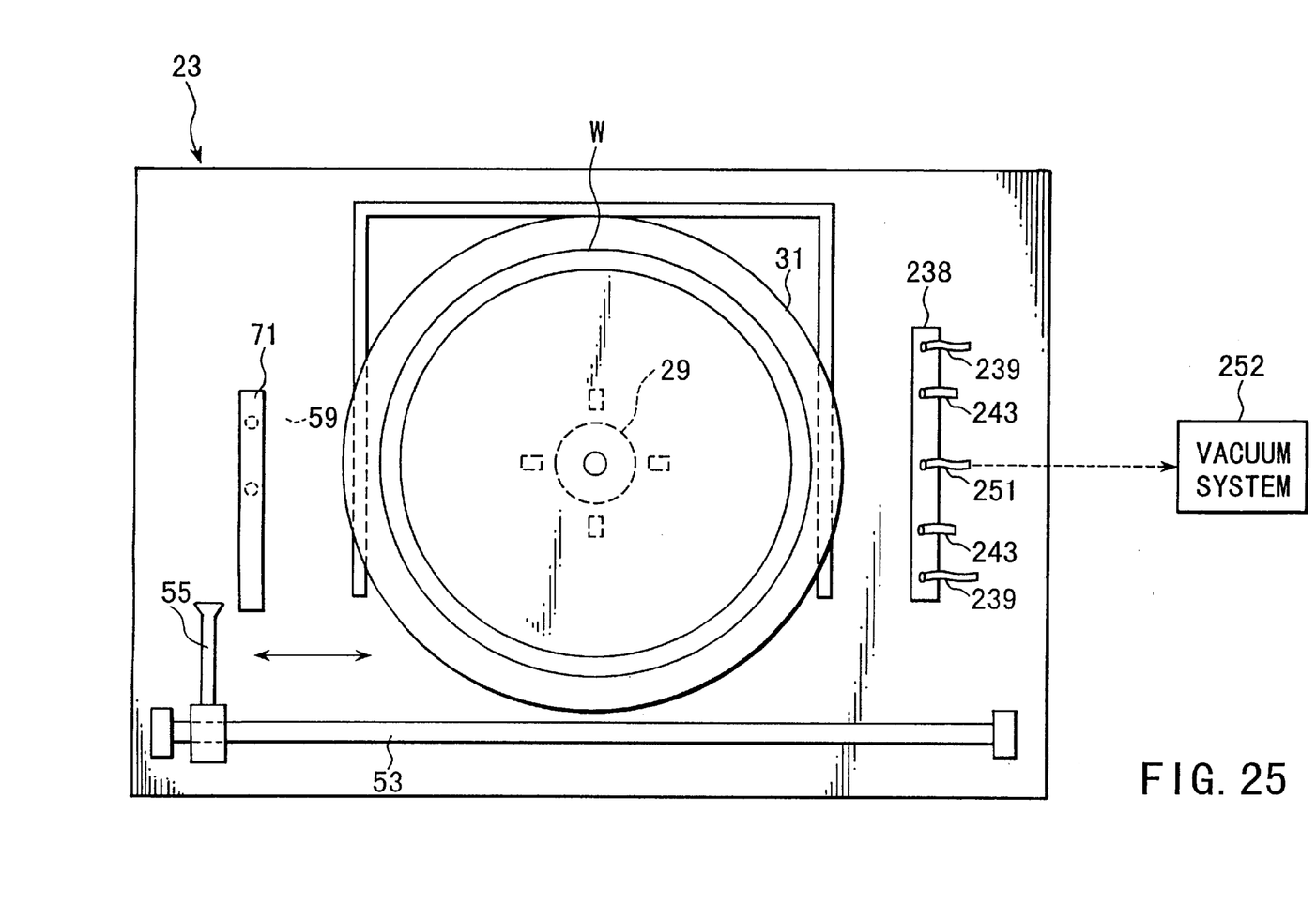
FIG. 25 is a plane view of a developing unit including the developing solution supply nozzle shown in FIG. 24.

As illustrated in FIG. 24 and FIG. 25, the deaerating module 250 is connected to a vacuum system 252 through a connecting pipe 251. The deaerating module 250 is formed of a material with quality which allows only gas modules to pass and hinders liquid modules from passing. According to the deaerating module 250, gas modules within the cylindrical body portion 241 can be eliminated immediately before discharge of the developing solution by operating the vacuum system. Consequently, no bubble exists in a developing solution discharged from the developing solution discharge openings 241*a*, which makes it possible to perform uniform developing treatment for the wafer W together with the aforementioned reduction in discharge pressure of the developing solution.

In the aforementioned embodiment, a substrate is the wafer W, but the present invention is also applicable to a LCD substrate. In addition, in the aforementioned embodiment, a treatment solution supply portion is embodied as a developing solution supply nozzle for supplying a developing solution, but the present invention is also applicable to treatment solution supply portions for supplying various kinds of treatment solutions. A developing unit provided with other plural treatment solution supply portions, for example, four developing solution supply portions is also available.

Figure 26:
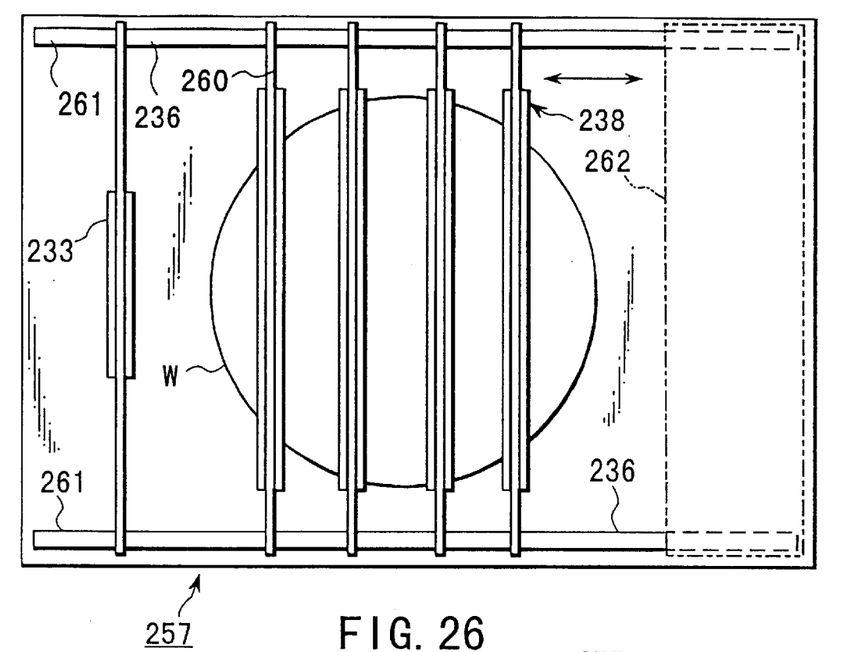
FIG. 26 is a plane view showing the state of a developing solution being coated by means of a developing unit according to yet another embodiment.

FIG. 26 shows a plane view of a developing unit 257 provided with four developing solution supply nozzles 238 as described above according to another embodiment. In the developing unit 257, carrier rails 236 and 236 are disposed opposite each other across the wafer W in a longitudinal direction of the developing unit 257. A frame for suspension 260 for suspending and supporting the developing solution supply nozzle 238 is slidably provided on the carrier rails 236 and 236.

Hence, with the movement of the frame for suspension 260 by means of a drive mechanism, the developing solution supply nozzle 238 supported by the frame for suspension 260 also freely moves in a direction shown with a reciprocating arrow in FIG. 26 within the developing unit 257, and four developing solution supply nozzles 238 can move over the wafer W. Thus, the supply of a developing solution to the whole surface of the wafer W is possible during the movement.

A container 262 accommodating four developing solution supply nozzles 238 in a row is provided on one side of the developing unit 257. The container 262 is always filled with atmosphere from a solvent of developing solution so as to prevent the developing solution discharge openings 241*a* of the cylindrical body portion 241 of the developing solution supply nozzle 238 from drying.

The developing unit 257 is structured as described above. In the developing unit 257, the developing solution supply nozzles 238 move to above the wafer W through the frames for suspension 260, and while the developing solution supply nozzles 238 move over the wafer W leaving a broad space between each other, a developing solution can be supplied for the wafer W from developing solution discharge openings on the lower surface of the cylindrical body portion 241. Thus, the developing solution can be coated on the wafer W without rotating the wafer W.

Figure 27:
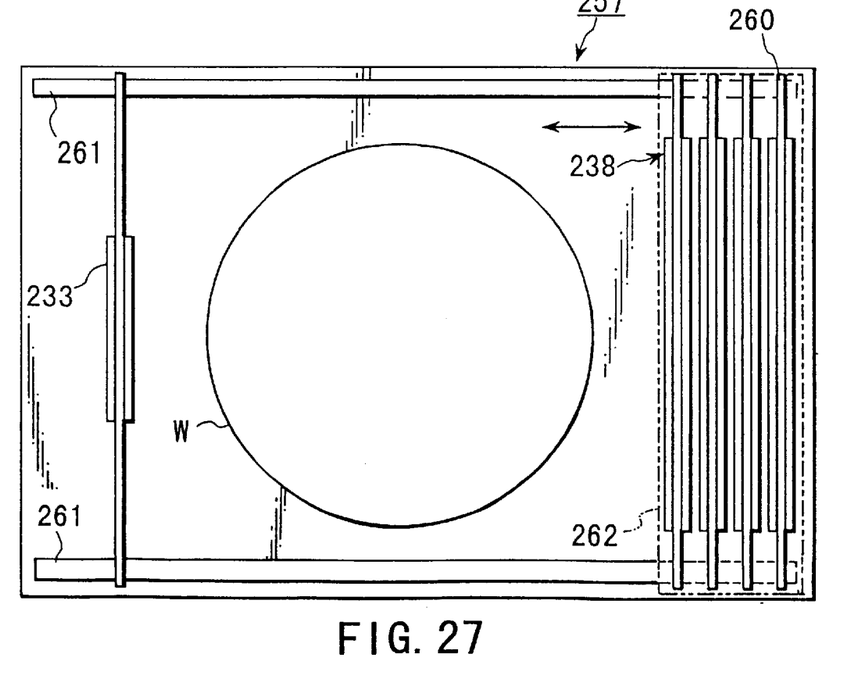
FIG. 27 is an explanatory view showing the state of developing solution supply nozzles in the developing unit shown in FIG. 26 being contained.

Since the wafer W is coated with a developing solution while the above four developing solution supply nozzles 238 leave a broad space between each other, swift supply of the developing solution for the wafer W is possible. After the predetermined supply of the developing solution for the wafer W is completed, each developing solution supply nozzle 238 is placed in a row in the container 262 through the frame for suspensions 260. At this time, four developing solution supply nozzles 238 can be placed in the container 262 by narrowing the space between each other as shown in FIG. 27. Accordingly, although the developing unit has four developing solution supply nozzles 238, these four developing solution supply nozzles 238 can be put away without occupying a lot of space.

If more than one washing solution supply nozzle 233 is used, reduction in washing hours is possible. Concerning the relation of height between the washing solution supply nozzle 233 and the developing solution supply nozzle 238, the washing solution supply nozzle 233 can be disposed in a higher position.

In the developing unit 257 shown in FIG. 26, a pan is disposed around under the wafer W so as to collect a developing solution which is supplied onto the wafer W from the developing solution supply nozzle 238 and drops therefrom, to filtrate the developing solution with a filter, for example, and to return it again to the developing solution supply nozzle 238, thereby saving the developing solution.

Figure 28:
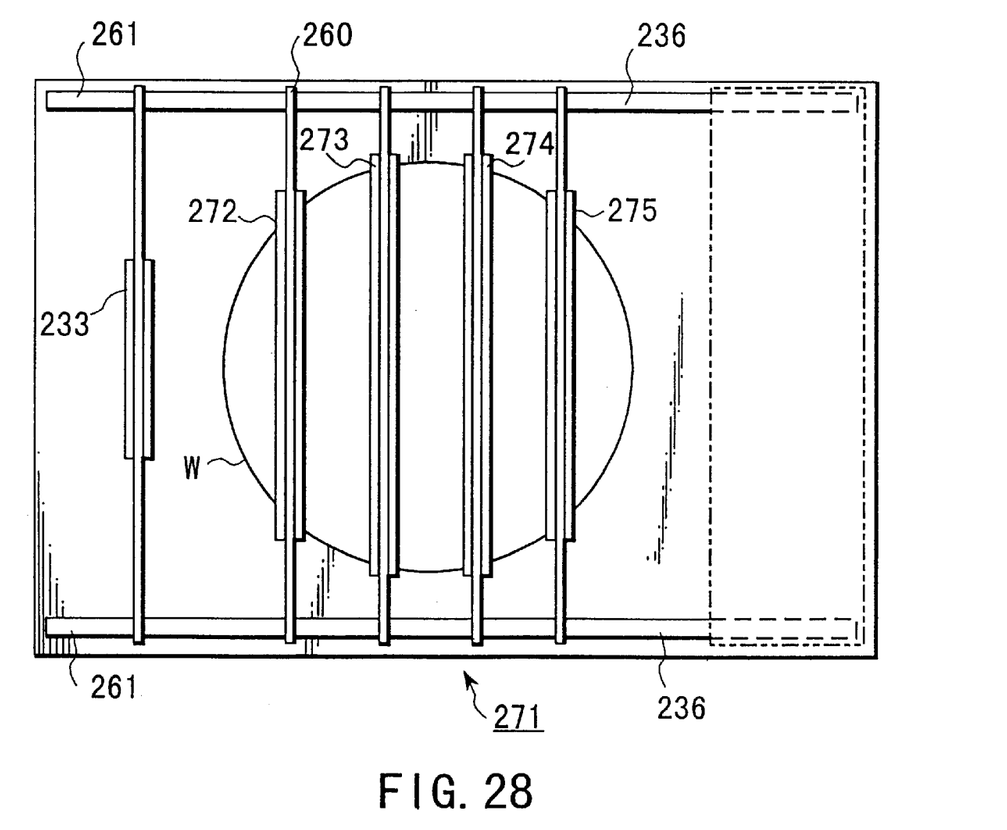
FIG. 28 is a plane view showing the state of a developing solution being coated by means of still another embodiment.

In the developing unit 257 shown in FIG. 26, four developing solution supply nozzles 238 has the same length, but like a developing unit 271 shown in FIG. 28, if out of four developing solution supply nozzles 272, 273, 274, and 275, the length of two developing solution supply nozzles 273 and 274 which are disposed in the center is slightly longer than the diameter of the wafer W, and the length of developing solution supply nozzles 272 and 275 which are disposed at both ends is slightly shorter than the diameter of the wafer W, the amount of a developing solution exhausted without being supplied onto the wafer W can be reduced.

As described above, according to the present embodiment, a collision body is disposed between discharge openings and a substrate. Therefore, even when the discharge pressure of a treatment solution is high, the discharge speed of the treatment solution at the time of reaching the substrate is reduced and damage to the substrate is eased, since the discharged treatment solution once collides against the collision body. Besides, the amount of air entering into the discharged treatment solution is reduced more than ever. Thus, the occurrence of micro-bubbles can be prevented more than ever.

According to the present embodiment, even when the discharge pressure of a treatment solution is high, the discharged treatment solution once collides against a collision bar and the discharge speed is once reduced by the collision bar. Furthermore, since the collision bar is disposed parallel to a plurality of discharge openings, the collision bar can contribute to reduction in speed of treatment solution discharged from all of discharge openings.

According to the present embodiment, discharge openings are disposed in two lines whereby a larger quantity of treatment solution can be supplied for a substrate. Thus, solution treatment hours can be reduced and throughput can be improved. The discharge speed of treatment solution can be eased by one collision bar. Consequently, a treatment unit can be simplified and reduced in weight.

When a substrate is coated with a treatment solution while being rotated with a nozzle which is disposed just on top of the diameter of a wafer and is provided with discharge openings forming a line over the length equivalent to the diameter of the wafer, the moving distance per unit hour is different between a center portion and an edge portion of the wafer W. Specifically, the moving distance in the center portion is shorter. Hence, in prior arts, the total damage is larger especially in the center portion and as a result it is extremely possible that a resist pattern peels off more in a center portion of the substrate than in an edge portion thereof. According to the present embodiment, a treatment solution discharged to a center portion of a substrate collides against a collision bar and discharge speed is reduced, but discharge speed is reduced less in an edge portion than in a center portion. Accordingly, the total degree of impact of the treatment solution against the whole substrate becomes uniform, whereby uniform treatment with a treatment solution over the whole surface of the substrate can be performed.

According to the present embodiment, a collision bar has a circular-shaped cross-sectional surface so that a treatment solution can be supplied for a substrate without remaining.

According to the present embodiment, a collision bar has an inverted triangle-shaped cross-sectional surface, which makes it possible to reduce the amount of air entering into a treatment solution when the treatment solution is discharged from discharge openings. Thus, effect of prevention of occurrence of micro-bubbles in a treatment solution film formed on a substrate is increased.

According to the present embodiment, since a suction mechanism for sucking a treatment solution adhering to a collision bar is provided, the treatment solution adhering to the collision bar can be sucked after the discharge of the treatment solution toward a substrate is completed. Accordingly, there is no fear that the treatment solution drips down from the collision bar and the treatment solution does not exert any influence on a substrate and peripheral units.

According to the present embodiment, washing solution discharge portions for discharging a washing solution toward discharge openings are provided in a collision bar which makes it possible to wash the discharge openings with the washing solution discharged from the washing solution discharge portion and to keep the discharge openings clean. Washing of the discharge openings by discharge of a washing solution may be performed every time the designated times of solution treatment finish or after a laps of the designated period. As a washing solution, purified water, for example, can be used.

According to the present embodiment, discharge pressure of a washing solution discharged from washing solution discharge portion is variable. Under high discharge pressure, for example, discharge openings can be washed by discharging a washing solution directly to the discharge openings, and under low discharge pressure where a washing solution does not reach discharge openings, the discharged washing solution directly drips down along the surface of a collision bar. In the latter case, it is possible to wash a collision bar itself.

According to the present embodiment, at least a part of a nozzle is a hollow cylindrical body formed of a porous film, which facilitates the fabrication of a treatment solution supply portion such as developing solution supply nozzle. Due to a plenty of holes in a porous film, a great deal of treatment solution can be supplied for a substrate such as a wafer or the like. Therefore, the occurrence of micro-bubbles can be prevented. In addition, impact is eased and a resist pattern is prevented from peeling off, for example.

According to the present embodiment, a flow path through which a temperature controlling fluid for controlling the temperature of a treatment solution flows is provided within a cylindrical body of the aforementioned treatment solution supply portion, whereby the structure of a treatment solution supply portion such as a developing solution supply nozzle is simple and it becomes easy that the treatment solution just before being discharged is supplied for a substrate such as a wafer at the desired temperature.

According to the present embodiment, a deaerating mechanism for eliminating gas molecules in a treatment solution is provided in a cylindrical body, whereby a treatment solution can be deaerated immediately before being discharged.

According to the present embodiment, an upper surface of a cylindrical body is supported with a frame, which makes it possible to swiftly move a treatment solution supply portion itself and the structure thereof becomes firm.

The above-described embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A solution treatment apparatus comprising;

means for holding a first surface of a substrate having the first surface and a second surface on which a photoresist film is formed, and for rotating the substrate;

a linear nozzle, having at least one discharge opening, for discharging a treatment solution through the discharge opening toward the second surface of the rotated substrate;

means for supplying the treatment solution to said nozzle; and a linear bar, disposed between the discharge opening of said linear nozzle and the second surface of the substrate such that said linear bar is located along said linear nozzle and close to the discharge opening thereof, against which the treatment solution discharged from said linear nozzle collides.

2. The apparatus as set forth in claim 1, wherein said nozzle includes a plurality of the discharge openings which are arranged at regular predetermined intervals, and wherein said linear bar is a bar disposed substantially parallel to an array of the discharge openings.

3. The apparatus as set forth in claim 1, wherein said nozzle includes a plurality of the discharge openings disposed in two lines and the discharge directions thereof are set inward each other, and wherein said linear bar is a bar disposed substantially parallel to an array of the discharge openings.

4. The apparatus as set forth in claim 1, wherein said nozzle includes a plurality of the discharge openings which are arranged at regular predetermined intervals, and wherein said linear bar is a projecting bar disposed slantwise relative to an array of the discharge openings to rotate on a center of a line of the discharge openings.

5. The apparatus as set forth in claim 1, wherein said linear bar is a collision bar with a circular-shaped cross-sectional surface.

6. The apparatus as set forth in claim 1, wherein said linear bar is a collision bar with an approximately inverted triangle-shaped cross-sectional surface.

7. The apparatus as set forth in claim 1, wherein said linear bar includes a suction mechanism for sucking the treatment solution adhering to said linear bar.

8. The apparatus as set forth in claim 1, wherein said linear bar includes a washing solution discharge portion for discharging a washing solution toward the discharge opening.

9. The apparatus as set forth in claim 1, wherein said linear nozzle includes a plurality of the discharge openings which are arranged at regular intervals, and wherein said linear bar is a bar disposed approximately parallel to said nozzle, an approximately center portion of the bar is disposed opposite to the discharge openings, and as a portion thereof deviates from the center portion thereof, the portion is further apart from the discharge openings.

10. The apparatus as set forth in claim 8, which further comprises:

means for determining a discharging pressure of the washing solution which is discharged from the washing solution discharge portion; and a controller for controlling the discharging pressure of the washing solution from the washing solution discharge portion on the basis of the discharging pressure determined by said determining means.

11. The apparatus as set forth in claim 10, wherein when said linear nozzle is washed, said controller controls the discharging pressure of the washing solution from the washing solution discharge portion so that the washing solution reaches the discharge opening of said linear nozzle; and when said linear bar is washed, said controller controls the discharging pressure of the washing solution from the washing solution discharge portion so that the washing solution reaches the discharge opening of said linear nozzle.

12. The apparatus as set forth in claim 10, wherein said linear bar is coated with a hydrophobic coating material.

13. The apparatus as set forth in claim 10, wherein said linear bar has a slot which is open in a lower portion of said linear bar.

* * * * *